United States Patent
Masuda (10) Patent No.: US 7,737,689 B2
(45) Date of Patent: Jun. 15, 2010

(54) VESSEL FOR RARE GAS FILLING, AND METHOD FOR POLARIZATION OF RARE GAS ATOMIC NUCLEUS USING SAID VESSEL

(75) Inventor: Yasuhiro Masuda, Tsukuba (JP)

(73) Assignee: High Energy Accelerator Research Organization, Tsukuba-shi (JP)

( * ) Notice: Subject to any disclaimer, the term of this patent is extended or adjusted under 35 U.S.C. 154(b) by 295 days.

(21) Appl. No.: 11/887,141

(22) PCT Filed: Mar. 27, 2006

(86) PCT No.: PCT/JP2006/306159

§ 371 (c)(1),
(2), (4) Date: Apr. 1, 2008

(87) PCT Pub. No.: WO2006/104096

PCT Pub. Date: Oct. 5, 2006

(65) Prior Publication Data

US 2009/0101806 A1    Apr. 23, 2009

(30) Foreign Application Priority Data

Mar. 28, 2005    (JP) ............................. 2005-091575

(51) Int. Cl.
*G01V 3/00*    (2006.01)
(52) U.S. Cl. ....................................... 324/305; 324/304
(58) Field of Classification Search ................. 324/305, 324/304
See application file for complete search history.

(56) References Cited

U.S. PATENT DOCUMENTS

| | | | |
|---|---|---|---|
| 5,225,778 A * | 7/1993 | Chaillout et al. | 324/304 |
| 6,590,923 B1 * | 7/2003 | Batelaan et al. | 372/74 |
| 6,942,467 B2 * | 9/2005 | Deninger et al. | 417/313 |
| 7,385,395 B2 * | 6/2008 | Pines et al. | 324/301 |

FOREIGN PATENT DOCUMENTS

JP    A-2003-502132    1/2003

OTHER PUBLICATIONS

Earl Babcock, et al., "Hybrid Spin-Exchange Optical Pumping of $^3$He," Physical Review Letters; Sep. 19, 2003; vol. 91, No. 12.

(Continued)

*Primary Examiner*—Louis M Arana
(74) *Attorney, Agent, or Firm*—Oliff & Berridge, PLC (57) ABSTRACT

A vessel for rare-gas filling is provided that is capable of realizing a substantially completely circularly polarized light state in the vessel by using a single crystal material for a light entrance window. To this end, the thickness and the crystal axis orientation of the single crystal material are optimized. A polarization method of rare-gas nucleus using such a vessel is also provided. Embodiment of the vessel and the polarization method include those in which (1) an alkali resistance is high, (2) a pressure resistance is high, (3) no permeation of 3He occurs, and (4) a neutron absorption corresponds to applications to basic science, for example, neutron scattering is negligible. The vessel for rare-gas filling includes a vessel body and a pipe connected to the vessel body for introducing a rare-gas containing gas and an alkali metal into the vessel body. The vessel body is provided with a light entrance window made of a single-crystal material of which the thickness and crystal axis orientation have been adjusted to be a predetermined thickness and orientation, respectively. The vessel for rare-gas filling is preferably formed of sapphire or the like.

10 Claims, 2 Drawing Sheets

OTHER PUBLICATIONS

Yasuhiro Masuda, et al., "23pSC-1 $^3$He polarization with a birefringement laser optical pumping," High Energy Accelerator Research Organization, KEK, The Physical Society of Japan Koen Gaiyoshu, vol. 54, No. 2, separate vol. 1, 1999, p. 48

* cited by examiner

VESSEL FOR RARE GAS FILLING, AND METHOD FOR POLARIZATION OF RARE GAS ATOMIC NUCLEUS USING SAID VESSEL

TECHNICAL FIELD

The present invention relates to a vessel for rare-gas filling, and a method for polarization of rare-gas nucleus using the vessel.

BACKGROUND

Magnetic resonance imaging (MRI) diagnostic apparatuses have been put into practical use as a method of examining an internal structure of an object to be measured without injury. At present, many such apparatuses are being operated at general hospitals in local communities and so on, playing an active role on site in medical image diagnostics along with X-ray CT. The MRI exploits the interaction between an atomic nucleus spin (nuclear spin) and an electromagnetic field, which is called as nuclear magnetic resonance (NMR). The resonance energy may be frequencywise converted into a frequency of several tens of megahertz (the frequency band used for FM radio transmission). In the MRI, therefore, the electromagnetic energy irradiated to a test body is fairly low as compared with visible light and X-rays, and is less invasive. However, the low interaction energy for NMR/MRI leads to a related disadvantage, i.e. low detection sensitivity, in theory. In reality, although the MRI diagnostic has become widely used, its resolution is lower than that of X-ray CT. Moreover, since MRI is directed to the hydrogen nucleus (proton, 1H), which has the largest interaction energy among atomic nuclei, it visualizes the density of hydrogen atoms in water, or lipid of a living tissue. Therefore, MRI has found few applications on organs having a low hydrogen density such as the lung. To address such problems, research has been conducted into improving the detection sensitivity of MRI, including application of a very high magnetic field and high coil efficiency. Each attempt at improvement, however, seems to have reached a plateau. In order to achieve an even higher sensitivity, it will be necessary to introduce an innovative technology which studies in depth the principle of NMR. Practical examples of research which has been achieving a success in fulfilling the above described demands include an introduction of a rare gas having a high nuclear spin polarization.

Gases having no sensitivity to MRI at a normal pressure will drastically change the characteristics of MRI when the polarization of nuclear spin of the gases are increased. The nuclear spin polarization of rare gases have been studied for application to the basic science. A method increasing nuclear spin polarization in a rare gas is as follows. The rare gas is filled in a vessel together with an alkali metal such as rubidium or the like. The contents of the vessel are then irradiated with circularly polarized light. Matching the wavelength of the light to the D1 resonance of the alkali metal atom results in a polarization of electron spin of the alkali metal atom due to D1 resonance absorption. The polarized alkali atom collides with the rare gas atom. Through a hyperfine interaction between the electron spin and the rare-gas nuclear spin upon collision, the electron spin polarization is transferred to the nuclear spin polarization. The nuclear spin polarization of the rare gas obtained through this method is very high as compared with a nuclear spin polarization in the conventional MRI. When such a polarization is applied to MRI, the sensitivity will increase by a factor of several tens of thousands to obtain a magnetic resonance signal stronger by not less than 1000 times that of the same volume of water, so that such a rare gas has come to be used for MRI.

In the application to MRI, a polarized rare gas is supplied to a test body in two ways. One way involves a method in which the rare gas is stored together with an alkali metal vapor in a vessel under a static magnetic field. The vessel is irradiated with a laser light to polarize the atomic nucleus of the rare gas through the laser light irradiation, and the rare gas is then supplied to the test body. The other way involves (1) a method in which a mixed gas of the rare gas and the alkali metal vapor is passed through a laser light irradiating part in a static magnetic field to continually polarize the rare gas, and the rare gas is supplied to the test body, or (2) a method using a flow-type polarization vessel conducting the polarization while flowing the mixed gas. The sensitivity of MRI is determined by (1) the energy of the interaction between the nuclear spin and the electromagnetic field, and (2) the product of a square of the nuclear spin polarization and the number of polarized nuclei. This latter product provides a figure of merit for optimization that depends on various parameters. These parameters include, but are not limited to, intensity and circular polarization of laser light in the D1 resonance, a spin exchange rate between the electron spin and the nuclear spin, a spin relaxation time, a pressure of the rare gas, a pressure of nitrogen gas or 4He gas added thereto, and so on. The intensity and circular polarization of the laser light are preferably comparatively high. The spin exchange rate is determined by a combination of a rare gas and an alkali metal and the alkali-metal atomic number density, and the value of the spin exchange rate is preferably comparatively high. The alkali atomic number density is dependent on a temperature. The spin relaxation times of the electron and the nucleus depend on the alkali atomic number density, gas pressure, vessel wall and so on, in which the relaxation time is preferably comparatively long. Taking into consideration all of the above, conditions most suitable for a polarization vessel are as follows:

(1) the light incident part of the vessel should not impair the intensity of the laser light generating D1 resonance;

(2) a more completely circularly polarized light in the vessel should be realized in order to promote a high nuclear spin polarization;

(3) paramagnetic impurities should be decreased on the surface of the vessel as far as possible in order to obtain a long relaxation time;

(4) the vessel should have a high alkali resistance;

(5) the vessel should have a high pressure resistance because a higher gas pressure in the vessel, for example not less than several atmospheric pressure, is preferable; and (6) when the vessel is used for the polarization of 3He, the vessel should have no permeability for 3He.

Further, when the vessel is applied to basic science, especially when it is used in precision experiments and the like, it is required to have an certain accuracy, so that (7) the thickness and material of the vessel are preferably uniform; and when the vessel is used in an neutron scattering experiment, (8) the material of the vessel must have a transparency for neutrons.

JP-A-11-309126 describes an apparatus for producing a polarized rare gas. A flow-type polarization vessel of a coaxial, multi-cylindrical configuration is created by combining outer and inner cylinders, each made of silica glass with a clearance of 0.5 mm. A mixed gas of a rare gas and a vapor of an alkali metal, such as rubidium, is caused to flow in one direction into the clearance. An excited light is irradiated into the flow-type vessel and a magnetic field is applied perpendicularly to the excited light irradiating surface. However, in the apparatus for producing the polarized rare gas according to JP-A-11-309126, since amorphous silica glass is used for both the outer cylinder and inner cylinder constituting the flow-type vessel, circularly polarized laser light will pass through the silica glass from the curved outer cylinder into the clearance to cause the scattering of the laser light, thereby impairing the intensity of the laser light. Moreover, the circular polarization may significantly collapse. The decrease of laser light intensity and the collapse of circularly polarized light will deteriorate the performance of the rare gas polarization. Further, although the vessel must be chemically resistant to a high temperature alkali-metal vapor, the glass vessel used for the above application is less chemically resistant to a high temperature alkali metal. As such, the vessel may deteriorate in a short period of time. When the apparatus is used for 3He gas, there is a problem in that 3He permeates into the glass. Further, since the vessel for rare gas polarization made by glass sculpture cannot have generally uniform thickness and material, there is a problem in the incumbent reduced accuracy when being used for precision experiments in basic science.

JP-A-2003-502132 describes a flow-type polarization vessel of such a configuration that a flat disc-shaped glass window is fitted onto ends of a glass cylinder. When using a diode laser, the oscillation width is significantly smaller than the natural width of the D1 resonance, so that the gas pressure is raised for the purpose of expanding the resonance width by a Doppler effect. Further, a light entrance window is made flat for the purpose of preventing the intensity reduction of the laser light. However, the light entrance window of the flat glass plate cannot obtain the required pressure resistance unless it has a sufficient thickness. Actually, in the polarization vessel according to JP-A-2003-502132, a thick disc having a thickness of not less than 5 mm is used in the light entrance window with a diameter of 24 mm. In the polarization of the rare-gas nucleus, it is important that the circular polarization of the incident light is large. JP-A-2003-502132 describes that the window should not have birefringence so as not to impair the circular polarization of laser light. However, when welding such glass, a problem of strain cannot be avoided. Birefringence may occur even at a slight strain, and collapse the circularly polarized light. The effect of birefringence increases in proportion to the window thickness. Further, the high temperature alkali-metal vapor adheres to, and penetrates into, the glass surface to corrode it. The alkali-metal atoms located on the glass surface are not polarized, so that the nuclear spin polarization of the rare gas is significantly depolarized. Also, when the flow-type vessel is used for 3He polarization, it is necessary to increase the spin exchange rate, and hence potassium may be used in addition to rubidium (see, e.g., E. Babcock et al., Phys. Rev. Lett. 91, 123003 (2003)). The problem on the corrosion resistance becomes more serious. Since 3He permeates into glass, this may also cause a problem. And, a vessel using such a thick glass may not be suitable for use in basic science. Additionally, the vessel shown in JP-A-2003-502132 uses a glass material containing boron. Such a glass material absorbs neutrons. As the thickness of the glass is increased, the glass is less likely to allow the passage of neutrons, thus disabling the experiment of neutron scattering.

JP-A-2003-245263 describes a structure having a light entrance window in which quartz or sapphire having an excellent light transmittance is used in a part or entire part of the flow-type polarization vessel. JP-A-2003-245263 merely mentions quartz and sapphire as an example of the material having an excellent light transmittance for the light entrance window, but there is neither any description nor suggestion of the kind of crystal, such as a single crystal and a polycrystal, or the determination of the orientation of crystal axis.

SUMMARY

It is, therefore, an object of the various disclosed exemplary embodiments to provide a vessel for rare-gas filling, which can realize substantially a completely circularly polarized light in the vessel by using a single-crystal material. A single-crystal material should be chosen in which a kind, thickness and crystal axis orientation are optimized for use in a light entrance window, and a method for polarization of rare-gas nucleus using such a vessel. The single-crystal material should also be chosen and/or optimized to promote the above described vessel and polarization method. The single-crystal material should have properties that make it excellent in alkali resistance and pressure resistance and having no permeability of 3He and little propensity for neutron absorption so as to be adapted for applications to basic science, for example, neutron scattering or the like.

The inventors have made various studies in order to achieve the above objects and have completed a vessel for rare-gas filling and a method for polarization of a rare-gas nucleus using such a vessel.

That is, the summary and construction of a vessel are as follows:

(1) A vessel for rare-gas filling, comprising a vessel body and an introduction part connected to the vessel body and introducing a rare-gas containing gas and an alkali metal into the vessel body, wherein the vessel body is provided with a light entrance window made of a single-crystal material of which the thickness and crystal axis orientation are adjusted to be a predetermined thickness and a predetermined orientation, respectively.

(2) A vessel for rare-gas filling according to the item (1), wherein the light entrance window has birefringence.

(3) A vessel for rare-gas filling according to the item (1) or (2), wherein the light entrance window is made of sapphire or quartz.

(4) A vessel for rare-gas filling according to the item (1), (2) or (3), wherein the light entrance window is a flat plate.

(5) A vessel for rare-gas filling according to any one of the items (1) to (4), wherein the vessel body is made of the same single-crystal material as in the window, and a crystal axis orientation thereof is in the same orientation as in the window.

(6) A vessel for rare-gas filling according to any one of the items (1) to (5), wherein when linearly polarized light is used as an incident light on the window, a single crystal having birefringence is used as a material for the window, and a direction of c-axis as one of crystalline axes forming a principal optic axis is made parallel to a light incident plane of the window, and its thickness is made to a predetermined thickness, and on that basis, the linearly polarized light is entered perpendicular to the light incident plane so as to incline its orientation by 45 degrees with respect to the direction of c-axis.

(7) A vessel for rare-gas filling according to any one of the items (1) to (5), wherein when circularly polarized light is used as an incident light on the window, a single crystal having birefringence is used as a material for the window, and a direction of c-axis thereof is perpendicular to a light incident plane of the window or the direction of c-axis is horizontal with respect to the light incident plane of the window, and its thickness is made to a predetermined thickness, and on that basis, the circularly polarized light is entered perpendicularly to the light incident plane of the window.

(8) A vessel for rare-gas filling according to any one of the items (1) to (7), wherein the vessel body is cylindrical and the light entrance window is disc-shaped and is joined to one end of the cylindrical vessel body.

(9) A vessel for rare-gas filling according to any one of the items (1) to (8), wherein the introduction part comprises a first pipe portion located on a side connected to the vessel body or its flat plate part and made of the same single-crystal material as in the vessel body, and a second pipe portion connected to the first pipe portion and formed by joining a plurality of glass materials having a difference of thermal expansion to the first pipe portion that it varies stepwise from small to large.

(10) A method for polarizing rare-gas nucleus, which comprises using a vessel according to any one of the items (1) to (9) and entering light into the vessel from a light incident plane of a light entrance window to polarize rare-gas nucleus in a magnetic field.

Various exemplary embodiments according to this disclosure provide an advantageous effect in that a substantially completely circularly polarized light state can be realized in a vessel during the light incidence by disposing in the vessel body a light entrance window made of a single-crystal material of which the thickness and crystal axis orientation are adjusted to be a predetermined thickness and a predetermined orientation, respectively.

In the conventional glass vessel, the polarization of light may collapse when passing through the glass, and therefore it is difficult to realize a high polarization in the vessel. Various disclosed embodiments make it possible to achieve a higher polarization than that which was previously possible.

Various disclosed embodiments further develop the advantageous effects that the vessel is resistant to high pressures and chemically resistant to alkali metals at high temperatures. Such advantages are realized by making the entire vessel from sapphire or quartz. Since sapphire and quartz hardly absorb neutrons, even when they are used for a neutron scattering experiment, neutron loss is small and the generation of background is also small. Also, the thickness can be made uniform for neutrons, which is advantageous for use in precision experiments. Further, the permeation of 3He in sapphire or the like is negligible.

In various disclosed embodiments, the vessel body is made from the same single-crystal material as in the window and constituted so as to render the crystal axis orientation in a same orientation as the window. Additionally, the introduction part of the rare-gas containing gas and the alkali metal may be a first pipe portion located on a side connected to the vessel body or to a flat plate part of the body and made of the same single-crystal material as the vessel body, and may include a second pipe portion connected to the first pipe portion and formed by joining a plurality of glass materials differences in thermal expansion to the first pipe portion in which the second pipe portion varies stepwise from small to large, whereby it is made possible to be a vacuum vessel capable of sufficiently withstanding to thermal shock due to the temperature difference between the vessel body and the light entrance window during welding or the like.

BRIEF DESCRIPTION OF THE DRAWINGS

FIGS. 1(a) and (b) are perspective views illustrating an embodiment of two vessels for rare-gas filling;

DETAILED DESCRIPTION OF EMBODIMENTS

Embodiments of the vessel for rare-gas filling according to the present invention will be concretely described below.

FIGS. 1(a) and (b) are perspective views illustrating an example of the contour of the vessel for rare-gas filling according to this disclosure.

The vessel 1 for rare-gas filling shown in FIG. 1(a) includes a cylindrical vessel body 3 having two disc-shaped light entrance windows 2, 10 joined to both ends thereof, and a pipe 4 connected to the vessel body 3, or the disc-shaped portion 10 (only the one connected to the vessel body 3 is shown in the figure) as an introduction part for introducing a rare-gas containing gas and an alkali metal into the vessel body 3. Moreover, FIG. 1(b) shows a vessel adapted for a flow-type polarization by separating the pipe into two parts: a gas introduction part 4a and a gas discharge part 4b.

The vessel 1 for rare-gas filling is a vessel for the purpose of filling rare gas, and eventually, a vessel capable of irradiating a controlled polarized light to the rare gas. It can be adapted as a flow-type vessel in which a rare gas is polarized while flowing. The rare gas is not particularly limited, and may include, for example, xenon, helium 3 (He3) and so on. An example of the rare-gas containing gas is a mixed gas of a rare gas and a quenching gas, such as nitrogen gas. In addition to the rare-gas containing gas, an alkali metal is required to be introduced as a vapor into the vessel 1. The alkali metal is not particularly limited. Examples of the alkali metal may include rubidium, calcium, potassium and sodium.

A principal feature in the configuration lies in that the vessel body 3 is provided with a light entrance window 2 made from a single-crystal material which is adjusted to have a predetermined thickness and a predetermined crystal axis (c-axis) orientation. By adopting this configuration, a substantially completely circularly polarized light state in the vessel upon the incidence of light can be realized.

In order to prevent the polarized light from being impaired in the vessel upon the incidence of the polarized light, as described in JP-A-2003-502132, discussed above, a material having no birefringence was generally used in the light entrance window. In contrast, in the disclosed embodiments, a single-crystal material, preferably a single-crystal material having birefringence is intentionally used in the light entrance window and the thickness and crystal axis orientation thereof are adjusted to a predetermined thickness and a predetermined orientation, respectively, to attain a substantially completely circularly polarized light state in the vessel upon the incidence of light, whereby a substantially completely circularly polarized light is surely obtained in the vessel.

Examples of the single-crystal material, especially a single-crystal material having birefringence, are sapphire and quartz.

Since the light entrance window has birefringence, it is possible to precisely control the polarization of light entering the vessel, for example, by using a flat plate and adjusting the crystal axis and the thickness thereof. When light passes through a uniaxial crystal, phase shifting occurs between the component oscillating perpendicularly to the c-axis and the component oscillating in the c-axis direction. The phase shifting q is given as follows:

$$q=2p(no-ne)l_1/l_2$$

Where, no denotes a refractive index of the light oscillating perpendicularly to the c-axis as a principal optic axis, ne denotes a refractive index of the light oscillating in the c-axis direction, $l_1$ denotes a transmission distance of light, and $l_2$ denotes a wavelength of light. When the incident light is linearly polarized, the c-axis of the entrance window is perpendicular to the incident light and the linearly polarized direction of the incident light is 45 degrees with respect to the c-axis. Then, when the thickness of the window as a transmission distance of light is adjusted such that q is given as:

$$q=(n+1/2)p,$$

the linearly polarized light is converted to a circularly polarized light when it enters into the vessel. In this regard, n is an integer. When the incident light is circularly polarized, by adapting q as $$q=(n+1)p,$$

the circularly polarized light is maintained when it enters into the vessel. When the c-axis of the entrance window is parallel to the incident light, the refractive index for the incident light is no regardless of the direction of polarization, so that the polarization after transmission is unchangeable and the circularly polarized light will remain circularly polarized light. That is, the polarization does not change in the incidence of the circularly polarized light, while in the incidence of linearly polarized light, the linearly polarized light is converted into circularly polarized light, whereby a substantially completely circularly polarized light can be obtained in the vessel.

Figure 1:
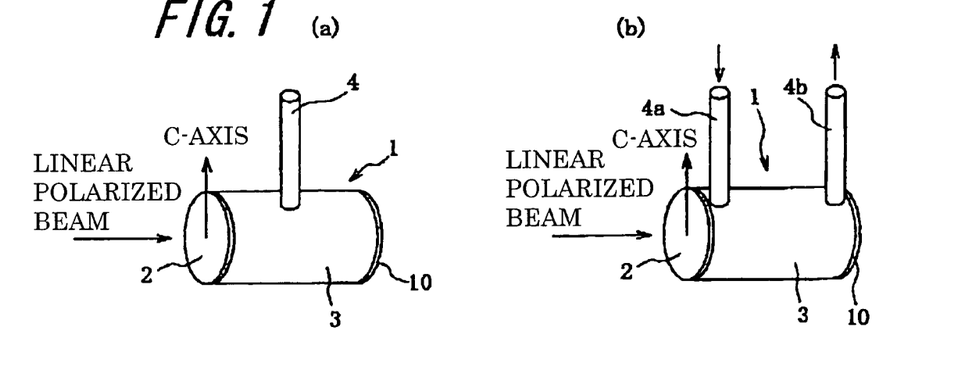

For example, when a linearly polarized light beam is used as a light to be entered into the window 2, as shown in FIG. 1, the thickness of the window 2 is rendered into q=(n+1/2)p, and the crystal axis (c-axis) orientation is parallel to the light incident plane of the window. Linearly polarized light is entered perpendicularly to the light incident plane 2a such that its direction is inclined at 45 degrees with respect to the crystal axis (c-axis) orientation. In this case, when the linearly polarized light beam enters into the vessel through the window 2, it is converted into circularly polarized light in the vessel. A substantially completely circularly polarized light can be realized in the vessel.

Figure 2:
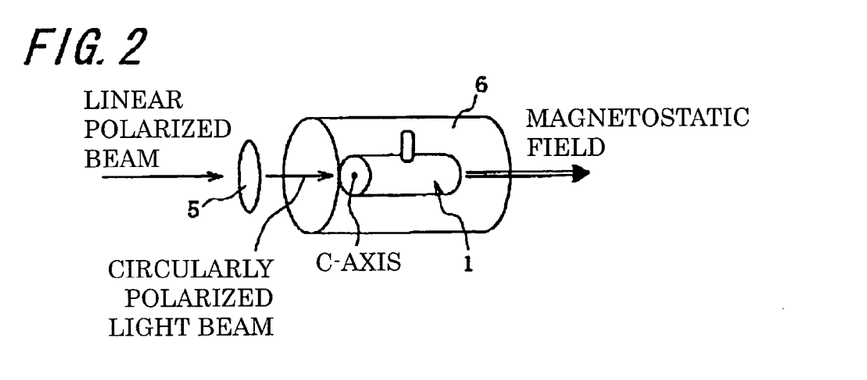
FIG. 2 is a schematic view showing an example of the polarization of alkali metal atoms and rare-gas nuclei.

Also, when a circularly polarized light beam is used as a light to be entered into the window 2, as shown in FIG. 2, the crystal axis (c-axis) orientation is perpendicular to the light incident plane 2a of the window 2, that is, in the thickness direction of the window 2, or the crystal axis orientation is horizontal to the light incident plane 2a of the window 2 and the thickness of the window 2 is given as q=(n+1)p. In this case, when a circularly polarized light beam enters perpendicularly to the light incident plane 2a of the window 2, the circularly polarized light is maintained in the vessel without the polarization being Affected. A substantially completely circularly polarized light can be realized in the vessel. Moreover, FIG. 2 shows an alternate configuration in which a circularly polarized light beam is obtained by using a linearly polarized light beam and a ¼ wavelength plate 5 is used as a light to be entered into the window 2 and the vessel 1 is placed in a heating furnace 6 (oven) to vaporize the alkali metal in the vessel. These examples are illustrative and should not be considered limiting.

It is preferable that the vessel body is made from the same single-crystal material as the window and the crystal axis orientation thereof is in the same direction as in the window.

A reason why a single-crystal material of sapphire or quartz is used in the light entrance window 2 or the vessel body 3 is that it is mechanically and chemically strong. Also, a surface of such a material can be cleaned and will not cause any problem when gas is introduced at a pressure of 1 to 10 atmospheres, and a temperature of 150 to 250° C. is used in the polarization. Also, such a substance is small in neutron scattering cross section and suitable for the application to neutron scattering. Moreover, considering that the light entrance window 2 and the vessel body 3 are joined to each other by welding or the like, they are preferably made from the same single-crystal material. Also, it is preferable that the crystal axis orientations of the vessel body 3 and the window 2 are aligned in the same orientation to form a structure capable of withstanding thermal shock associated with temperature differences acting on the vessel.

Figure 3:
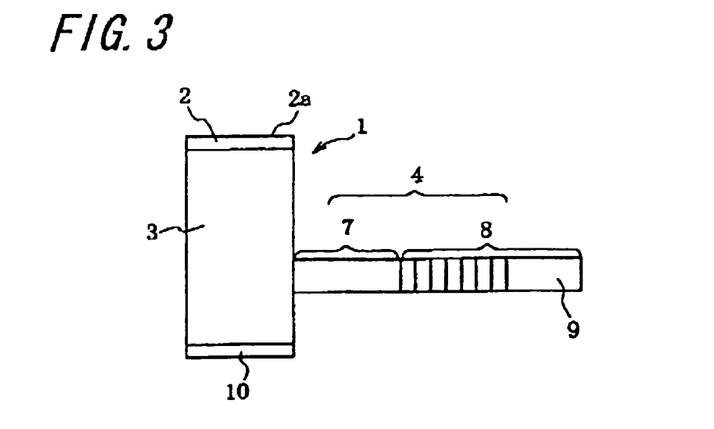
FIG. 3 is a schematic view illustrating a vessel body having a light entrance window and a pipe for introducing rare gas and alkali-metal vapor.

Furthermore, in the viewpoint of the structure capable of withstanding thermal shock associated with the temperature differences acting on the vessel, it is preferable that the pipe 4 for introducing a rare-gas containing gas and an alkali metal (vapor) includes a first pipe portion 7 located on a side connected to the vessel body 3 or the disc-shaped portion 10 and made of the same single-crystal material as in the vessel body 3, and also includes a second pipe portion 8 connected to the first pipe portion 7 and formed by joining a plurality of glass materials having different coefficients of thermal expansion to the first pipe portion 7 that in a manner where the differing thermal expansions vary stepwise from small to large. For example, when the light entrance window 2 and the vessel body 3 are made of sapphire, the first pipe portion 7 is sapphire, and the second pipe portion 8 may be fabricated by welding a plurality (5 to 8 kinds) of glass materials having different thermal expansions to the first pipe portion 7 (for example, sapphire). In this case, a tip portion 9 of the pipe 4 opposite to the vessel body 3 is made of a heat-resistant glass (for example, PYREX (registered trademark)) so as to be connectable with a vacuum apparatus or an apparatus for filling a rare gas and an alkali metal. Further, it can be baked under vacuum. In order to fill the rare gas and the alkali metal in the vessel, it is preferable that the window 10, made of the same single-crystal material as in the window 2, is used and joined to the other end of the vessel body by welding or the like.

After the filling, the tip portion 9 can be sealed by fusing. The plural glass materials have differing values for their coefficients of thermal expansion such that the difference of thermal expansion to sapphire varies stepwise from small to large, so that the breakage due to the temperature change can be prevented by varying stepwise the thermal expansion coefficient. In the welding of sapphire pieces, it is also preferable that the crystal axis orientation of the first pipe portion 7 is aligned with the crystal axis orientation of the vessel body 3 since the thermal expansion is dependent on the crystal axis.

The glass material used in the pipe tip portion 9 is not particularly limited, but may include, for example, borosilicate glass (heat-resistant glass from Corning Inc.) or any glasses equivalent therewith from a viewpoint of being suitable for vacuum vessels. As shown in FIG. 3, the pipe 4 is constituted with the first pipe portion 7 made of sapphire or quartz having an outer diameter of 5 to 10 mm and an inner diameter of 3 to 8 mm, preferably an outer diameter of 5.5 mm and an inner diameter of 3.5 mm, and the second pipe portion 8 made of joined glasses, wherein the thermal expansion coefficient varies stepwise from the first pipe portion (for example, sapphire) to the pipe tip portion 9 (for example, PYREX glass) in order that the jointed part is not broken when heated to a high temperature.

When forming the light entrance window 2, the vessel body 3 and the first pipe portion 7 constituting the vessel for rare-gas filling made of sapphire, they may be fabricated by preparing raw material of sapphire through Verneuil's method or the like, subjecting to cutting and grinding process shaping according to a usual manner through a thermal diffusion process. At this time, the vessel body 3 or the disc-shaped portion 10 to be joined to the pipe 4 is previously provided with a hole adapted for the pipe at a pipe joining position. In assembling them, the crystal axis orientations of the single-crystal materials (for example, sapphire) used in the light entrance windows 2 and 10, the vessel body 3 and the first pipe portion 7 are determined by X-ray diffractometry and the respective crystal axes are aligned with each other.

The thickness of the single-crystal material used in the flat plate for the light entrance window is preferable to be 1 to 5 mm of sapphire in view of securing pressure resistance at a reasonable cost. When sapphire is used in the flat plate for the light entrance window, the thickness required to obtain an equivalent pressure resistance may be less as compared with a case that a thick glass (5 mm or more) is used in the flat plate for the light entrance window.

Next, the polarization method of rare-gas nucleus will be described. The polarization method of rare-gas nucleus uses the vessel 1 and light is introduced into the vessel 1 from a light incident plane 2a of a light entrance window 2 to polarize rare-gas nucleus in a magnetic field (not shown).

The polarization method employs an optical pumping method. The optical pumping will be described below. First, a polarized state of spin is created in an outer-shell electron of an atom. In this case, an alkali metal atom such as rubidium (Rb) is utilized. The valence electron of Rb is one 5s orbital electron. The spin state of this electron in a magnetic field consists of a spin ($-\frac{1}{2}$) parallel to an external magnetic field and a spin ($+1/2$) not parallel thereto. They exist approximately in the same numbers at a thermal equilibrium state likewise the case of nuclear spin. When light having a wavelength of 795 nm for causing D1 resonance is irradiated, the electron is excited from s-orbital to p-orbital. At this time, when light having a dextrorotatory circular polarization with a helicity of +1 is irradiated, an angular momentum change of +1 occurs in the spin state of the electron from a momentum conservation law for absorbing the light. For this end, the transition from parallel spin to non-parallel spin is required and a transition from parallel spin to parallel spin is inhibited. That is, under this condition, only the parallel spin on the s-orbit is excited to the non-parallel spin state on the p-orbit. The excited state of electron spin gets back to the original state (ground state) through collision with a nitrogen molecule, but in this state, the mixing of the spin states is caused to revert to parallel and non-parallel ground states at the same proportion. As a result, parallel spins on the s-orbit are decreased, and non-parallel spins are increased to polarize electron spins.

Further, during the collision between the polarized alkali metal atom and the rare gas, a super-fine interaction occurs between the polarized electron and the rare gas nucleus to transfer the polarization of the alkali metal atom to the rare-gas nucleus.

The above description presents only an exemplary embodiment. Various modifications may be made within the scope of the claims.

In a first alternate example (Example 1), the vessel for rare-gas filling 1 is a colorless transparent vessel for sealing a rare gas of 1 to 10 atmospheric pressure and alkali metal of 1 mg to 1 g and is made from a single-crystal material such as colorless, transparent sapphire or quartz having birefringence. For example, two flat plates, e.g. two discs each having a thickness of 1 to 5 mm and a diameter of 30 to 100 mm are welded by a thermal diffusion method to both ends of a cylindrical vessel body 3 having a length of 30 to 100 nm to form a light entrance window 2. A similar window 10, and a pipe 4 for filling a rare gas or an alkali metal are attached to the flat plate or the vessel body 3. The filling pipe 4 is fabricated by welding a first pipe portion 7 made of sapphire and a second pipe portion 8 made from a plurality (5 to 8 kinds) of glass materials, and a pipe tip portion 9 of the second pipe portion 8 is made of PYREX glass and may be connected to a vacuum apparatus or an apparatus for filling a rare gas or an alkali metal. The pipe tip portion 9 can also be closed by fusing after the filling. The plural glass materials have thermal expansion coefficients corresponding to a middle value between those of sapphire and PYREX glass, which are varied stepwise to prevent breakage due to temperature change. In the welding of sapphire pieces, the crystal axes are aligned because the thermal expansion is dependent on the crystal axis.

The vessel 1 polarizes the alkali metal atom with a polarized light and further polarizes the rare gas nucleus. In the polarization, the vessel is heated to a high temperature of about 200° C. for vaporizing the alkali metal and the polarization of the light entering the vessel is controlled through the entrance window 2 so as to attain a substantially completely circularly polarized light in the vessel. The reason why sapphire is used as a material for the planar entrance window is due to its being chemically strong against the high-temperature alkali metal and mechanically strong for withstanding a high pressure in a flat plate form. Also, the thickness and material may be made uniform and the polarization of the light entering the vessel through the planar entrance window can be precisely controlled by utilizing the birefringence of sapphire.

When the incidence light is a linearly polarized light, the crystal axis and thickness of the entrance window can be adjusted to convert the linearly polarized light to circularly polarized light. The vessel 1 for rare-gas filling is fabricated by making the incidence plane 2a in parallel to the c-axis of sapphire and rendering the thickness of the entrance window into $q=(n+1/2)p$, and as light enters perpendicularly to the entrance window by inclining the direction of the linear polarization of incident light by 45 degrees from the c-axis, the linearly polarized light can be converted to circularly polarized light in the vessel. In this manner, it is possible to realize a substantially completely circularly polarized light in the vessel. This is important to obtain a high polarization ratio because the polarization ratio of the alkali metal atom or the rare-gas nucleus cannot exceed the polarization ratio of light.

When the incident light is a circularly polarized light, the incidence plane 2a is made perpendicular to the c-axis, whereby it is made possible to retain the circular polarization of the light entering the vessel. Even if the incidence plane 2a is in parallel to the c-axis, as the thickness is adjusted to $q=(n+1)p$, the circular polarization of the incident light on the vessel is unchangeable. That is, a substantially completely circularly polarized light can be attained in the vessel.

FIG. 2 shows a second example (Example 2) of polarization of alkali metal atom and rare-gas nucleus. For the polarization of the alkali metal atom and rare-gas nucleus, a linearly polarized light beam from a laser or the like is converted to a circularly polarized light beam through a ¼ wavelength plate and irradiated to a single crystal vessel filled with the rare gas and alkali metal. The vessel is placed in a heating furnace (oven) 6 for vaporizing the alkali metal placed in a uniform magnetic field of about several tens of gausses. The temperature of the oven 6 is about 200° C. The thickness and direction of the single-crystal materials for the window 2 entered with a circularly polarized light beam are adjusted to eliminate collapsing of polarization. For example, as shown in FIG. 2, when the c-axis is perpendicular to the light incident plane 2a of the window 2, the circular polarization will not collapse. When the c-axis is parallel to the light incident plane 2a of the window 2, as the thickness is adjusted to q=(n+1)p, the circular polarization will not collapse. Also, the linearly polarized light beam can be introduced directly into the vessel to convert it to circularly polarized light in the vessel. At this time, the thickness and direction of the entrance window are adjusted so as to be q=(n+1/2)p. In this case, the ¼ wavelength plate becomes unnecessary at the light incidence side.

When the circularly polarized light quantum is absorbed by the alkali metal atom in the vessel, the electron spin of the alkali metal atom is polarized, and the rare gas nuclear spin is polarized through super-fine interaction in the collision with the polarized alkali metal atom.

Figure 4:
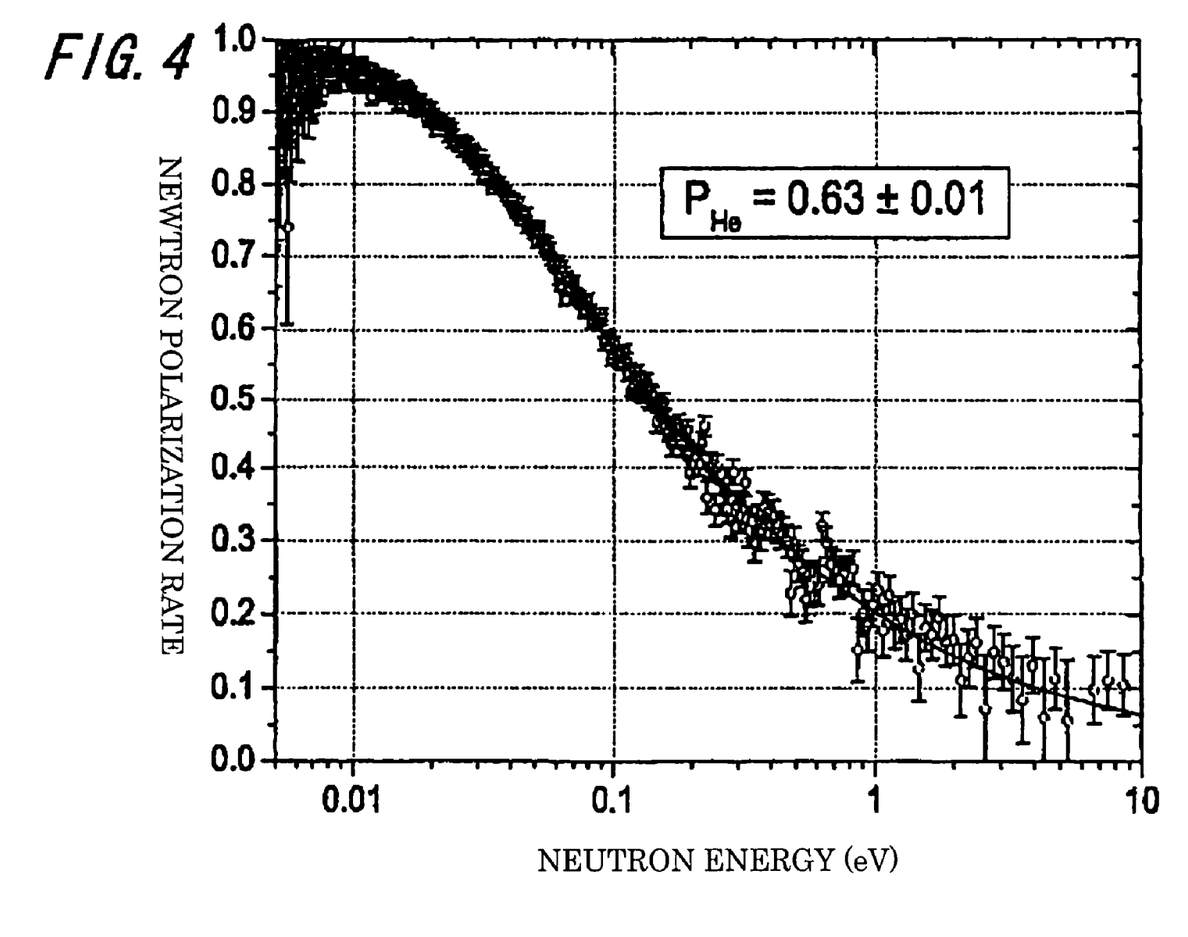
FIG. 4 is a graph showing the relationship between neutron polarization ratio and neutron energy.

The following shows another example (Example 3) of investigating whether or not a high circular polarization can be maintained for incident laser light in the vessel, and whether or not a high rare-gas nuclear spin polarization can be obtained. There is first described a method of determining a rare-gas nuclear spin polarization P from neutron transmittance. The neutron transmittance T of a rare gas inclusive of the vessel is represented as follows:

$$T = A \exp(-sNd) \cos h(PsNd)$$

Where, A is a neutron transmittance of a material such as a vessel or the like except for the rare gas, and is determined by experiment. Symbol s denotes a neutron cross section of rare-gas nucleus, N denotes a nucleus number density, and d denotes a thickness of the rare gas with respect to the neutron beam. When there is no polarization or P=0, transmittance T0 is given as:

$$T0 = A \exp(-sNd)$$

and since s has been determined by another experiment, a product of N and d is determined from the measurement of neutron transmittance. Thus, the nuclear spin polarization P is determined from the measurement of T and T0 with the following equation:

$$P = \cos h - 1(T/T0)/sNd$$

On the other hand, a neutron is polarized as it transmits through the polarized rare gas, and the resulting neutron polarization Pn is represented as follows:

$$Pn = (1(T0/T)2)1/2$$

In Example 3, rubidium is used as an alkali atom to polarize 3He, and the neutron polarization is measured from T and T0. The result is shown in the vertical axis as a function (horizontal axis) of neutron energy in FIG. 4. The nuclear spin polarization of 3He (3He polarization) is determined from the neutron polarization through the ratio of T and T0. At this time, the 3He polarization is determined for individual neutron energy, so that it can be determined with a high accuracy by using a least square fitting. In FIG. 4, circles denote experimental data, while the solid line represents a theoretical curve determined by the least square fitting. The 3He polarization ratio determined from them is (63±1) %.

According to the theory of optical pumping, the polarization Pa of the alkali metal atom is the same value as in circular polarization of the incident light when the intensity of the laser light is sufficient. After the laser irradiation, the rare-gas nuclear spin polarization will increase up to a saturation value Po. Po may be represented by the alkali atom polarization and spin exchange rate gse as follows:

$$Po = Pa gse/(gse+g)$$

Symbol g is a reciprocal 1/t of the time constant t called as a nuclear spin relaxation time, and when it is sufficiently smaller than gse, the value of Po becomes the same as the value of alkali atom polarization. Since t depends on the collision between the rare gas atom and impurities existing in the vessel wall, as the laser is deactivated, the rare-gas nuclear spin polarization collapses exponentially and this collapse can be expressed as follows:

$$P = Po \exp(-t/t)$$

In Example 3, the value of t is determined to be 24 hours from the measurement of the temporal change of P. The spin exchange rate gse is determined to be as 1/gse=5 hours from another experiment (Baranga et al., Phys. Rev. Lett, 80, 2801 (1998)).

In Example 3, the linear polarization of light from a 95% linearly polarized diode laser is converted to a circular polarization through the ¼ wavelength plate. This is irradiated into an entrance window of a polarization vessel having a thickness of 3.014 mm. At this time, an expected circular polarization ratio in the vessel is 87% (95% at a thickness of 3.008 mm. It should be noted that this value is a value at room temperature, and it is desired to measure the index of birefringence at 200° C.). Therefore, the value of Pa is expected to be 87% if the intensity of the laser light is sufficient. Further, since the value of gse/(gse+g) determined from the values of gse and g is 83%, the expected value of the rare-gas nuclear spin polarization ratio will be 72%. In reality, the temperature inside the vessel becomes higher than that of the oven due to laser irradiation, and depolarization for the alkali atom spin becomes larger to decrease the nuclear spin polarization. Taking this effect into consideration, the expected value of the rare-gas nuclear spin polarization ratio does not contradict the experimental value of 63%. When the intensity of the laser light is increased so as to overcome the depolarization for the alkali atom, the experimental value comes close to the expected value. As a result, it is concluded that the circular polarization of the laser light is substantially determined by the thickness of the light entrance window. Thus, it is concluded that, by adjusting the thickness of the light entrance window, a high circular polarization in the vessel, and hence a high rare-gas nuclear spin polarization, can be obtained.

The polarized rare-gases are applied to the tomography, that is, MRI for a human lung or brain. At this moment, the magnitude of rare-gas nuclear spin polarization is one of the parameters determining the sensitivity of MRI, so that the high polarization attainable from the systems and methods according to this disclosure is expected to contribute to the progress of MRI. The polarization of 3He, which is one of rare-gas nuclei, provides an ideal polarizer and polarization analyzer of neutrons. The high polarization and the elimination of the decay of neutron strength using sapphire or quartz will improve performances as a neutron polarizer or polarization analyzer, which greatly contributes to the exploration of various material structures including biological materials through polarized neutron scattering.

The invention claimed is:

1. A vessel for rare-gas filling, comprising:
   a vessel body, and
   an introduction part connected to the vessel body and introducing a rare-gas containing gas and an alkali metal into the vessel body,
   wherein the vessel body includes a light entrance window made of a single-crystal material of which the thickness and crystal axis orientation are adjusted to be a predetermined thickness and a predetermined orientation to promote a high circular polarization and a high rare-gas nuclear spin polarization in the vessel.

2. A vessel for rare-gas filling according to claim 1, wherein the light entrance window has birefringence.

3. A vessel for rare-gas filling according to claim 1, wherein the light entrance window is made of sapphire or quartz.

4. A vessel for rare-gas filling according to claim 1, wherein the light entrance window is a flat plate.

5. A vessel for rare-gas filling according to claim 1, wherein the vessel body is made of the same single-crystal material as the window, and a crystal axis orientation of the vessel body is in the same orientation as in the window.

6. A vessel for rare-gas filling according to claim 1, wherein when linearly polarized light is used as an incident light on the window, a single crystal having birefringence is used as a material for the window, and a direction of c-axis as one of crystalline axes forming a principal optic axis is made parallel to a light incident plane of the window, and the thickness of the window is made to a predetermined thickness, and on that basis, the linearly polarized light is entered perpendicularly to the light incident plane so as to incline its orientation at 45 degrees with respect to the direction of c-axis.

7. A vessel for rare-gas filling according to claim 1, wherein when circularly polarized light is used as an incident light on the window, a single crystal having birefringence is used as a material for the window, and a direction of c-axis thereof is perpendicular to a light incident plane of the window and the thickness of the window is made to a predetermined thickness, and on that basis, the circularly polarized light is entered perpendicularly to the light incident plane of the window.

8. A vessel for rare-gas filling according to claim 1, wherein the vessel body is cylindrical and the light incident window is disc-shaped and is joined to one end of the cylindrical vessel body.

9. A vessel for rare-gas filling according to claim 1, wherein the introduction part comprises:
   a first pipe portion located on a side connected to the vessel body or its flat plate part and made of the same single-crystal material as in the vessel body, and
   a second pipe portion connected to the first pipe portion and formed by joining a plurality of glass materials having different coefficients of thermal expansion to the first pipe portion such that the coefficients of thermal expansion vary stepwise from small to large for each of the plurality of glass materials in a direction away from the first pipe portion as they are joined.

10. A method for polarizing rare-gas nucleus, comprising:
    obtaining a vessel as claimed in claim 1, and
    introducing light into the vessel from a light incident plane of a light entrance window to polarize rare-gas nucleus in a magnetic field.

* * * * *